United States Patent
Ma

(10) Patent No.: US 9,543,539 B2
(45) Date of Patent: Jan. 10, 2017

(54) OLED DEVICE AND MANUFACTURING METHOD THEREOF AND DISPLAY APPARATUS

(71) Applicant: BOE TECHNOLOGY GROUP CO., LTD., Beijing (CN)

(72) Inventor: Wenyu Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 57 days.

(21) Appl. No.: 14/443,855

(22) PCT Filed: Sep. 18, 2014

(86) PCT No.: PCT/CN2014/086799
§ 371 (c)(1),
(2) Date: May 19, 2015

(87) PCT Pub. No.: WO2015/169023
PCT Pub. Date: Nov. 12, 2015

(65) Prior Publication Data
US 2016/0268537 A1    Sep. 15, 2016

(30) Foreign Application Priority Data
May 8, 2014   (CN) .......................... 2014 1 0191777

(51) Int. Cl.
*H01L 29/08*    (2006.01)
*H01L 51/52*    (2006.01)
(Continued)

(52) U.S. Cl.
CPC ....... *H01L 51/5203* (2013.01); *H01L 27/3244* (2013.01); *H01L 51/56* (2013.01)

(58) Field of Classification Search
CPC .................................................. H01L 51/5203
(Continued)

(56) References Cited

U.S. PATENT DOCUMENTS

2004/0017153 A1    1/2004   Nishikawa
2004/0160172 A1    8/2004   Tyan et al.
(Continued)

FOREIGN PATENT DOCUMENTS

CN    1444426 A    9/2003
CN    1543281 A    11/2004
(Continued)

OTHER PUBLICATIONS

Third Chinese Office Action Appln. No. 201410191777.0; Dated Sep. 8, 2015.
(Continued)

Primary Examiner — Ajay K Arora
(74) Attorney, Agent, or Firm — Ladas & Parry LLP

(57) ABSTRACT

An OLED device and a manufacturing method thereof and a display apparatus are provided. The OLED device comprises: a substrate, and a first electrode, an organic material function layer and a second electrode which are sequentially provided on the substrate. The OLED device further comprises an uneven layer provided between the first electrode and the substrate, and a surface of the uneven layer corresponding to the first electrode and away from the substrate is not even. The first electrode and/or the second electrode provided on a light output side of the OLED device comprise(s) a metal layer.

8 Claims, 3 Drawing Sheets

(51) Int. Cl.
*H01L 27/32* (2006.01)
*H01L 51/56* (2006.01)

(58) Field of Classification Search
USPC .......................................................... 257/40
See application file for complete search history.

(56) References Cited

U.S. PATENT DOCUMENTS

| | | | |
|---|---|---|---|
| 2010/0051446 A1* | 3/2010 | Wang | G03F 7/40 204/192.15 |
| 2014/0008628 A1 | 1/2014 | Yamana et al. | |
| 2014/0027753 A1 | 1/2014 | Yamana et al. | |
| 2016/0238893 A1* | 8/2016 | Wang | G02F 1/133555 |

FOREIGN PATENT DOCUMENTS

| | | |
|---|---|---|
| CN | 102270750 A | 12/2011 |
| CN | 103066214 A | 4/2013 |
| CN | 103444262 A | 12/2013 |
| CN | 103503571 A | 1/2014 |
| CN | 103972423 A | 8/2014 |
| CN | 203871381 U | 10/2014 |
| JP | 2011-154843 A | 8/2011 |
| KR | 1020060059067 A | 6/2006 |
| WO | 2013141675 A1 | 9/2013 |

OTHER PUBLICATIONS

Fourth Chinese Office Action Appln. No. 201410191777.0; Dated Dec. 3, 2015.
Chinese Notice of Allowance Appln. No. 201410191777.0; Dated Feb. 3, 2016.
International Search Report mailed Feb. 13, 2015; PCT/CN2014/086799.
Written Opinion of the International Searching Authority mailed Feb. 13, 2015, PCT/CN2014/086799.
First Chinese Office Action dated Jan. 26, 2015; Appln. No. 201410191777.0.
Second Chinese Office Action dated May 11, 2015; Appln. No. 201410191777.0.

* cited by examiner

US 9,543,539 B2

OLED DEVICE AND MANUFACTURING METHOD THEREOF AND DISPLAY APPARATUS

TECHNICAL FIELD

Embodiments of the disclosure relate to an OLED device, the manufacturing method thereof and a display apparatus.

BACKGROUND

Organic Light Emitting Diode (abbreviated to OLED) is an organic thin film electroluminescent device with the advantages of uncomplicated manufacturing process, low cost, suitable for flexible structure, wide viewing angle and the like. Therefore, OLED based display technology has been an important display technology.

At present, light output efficiency of the OLED is relatively low, generally speaking, only a little amount of light is extracted to the environment. One reason thereof is that when the light from light-emitting layer is incident onto an even surface of a metal electrode, surface plasma electromagnetic waves generated thereby are unable to be extracted to the environment as these electromagnetic waves propagate transversely along the even surface of the metal electrode.

SUMMARY

In the embodiments of the disclosure, an OLED device is provided. The OLED device comprises: a substrate, and a first electrode, an organic material function layer and a second electrode which are sequentially provided on the substrate. The OLED device further comprises an uneven layer provided between the first electrode and the substrate, and a surface of the uneven layer corresponding to the first electrode and away from the substrate is not even. The first electrode and/or the second electrode provided on a light output side of the OLED device comprise(s) a metal layer.

For example, the uneven layer is a photoresist layer doped with small particles; and the small particles are exposed from a surface of the photoresist layer corresponding to the first electrode and away from the substrate.

For example, a particle size of the small particles is less than 10 nm.

For example, the small particles comprise small ceramic particles and small metal particles; and in the case that the small particles comprise the small metal particles, the OLED device further comprises an insulating layer provided between the photoresist layer and the first electrode.

For example, a portion of the uneven layer corresponding to the first electrode comprises poly-silicon; and the poly-silicon is obtained by crystallizing amorphous silicon.

For example, the first electrode comprises a non-transparent metal layer, and the second electrode comprises a transparent metal layer.

In the embodiments of the disclosure, a display apparatus is provided and the display apparatus comprises the OLED device as above.

For example, the display apparatus further comprises a thin film transistor provided between the substrate and the uneven layer of the OLED device. A drain electrode of the thin film transistor is electrically connected with the first electrode of the OLED device.

For example, the uneven layer is the photoresist layer doped with small particles, and the doping concentration of the small particles ranges from 80% to 90%.

In the embodiments of the disclosure, a method of manufacturing an OLED device is provided. The method comprises: forming a first electrode, an organic material function layer and a second electrode sequentially on a substrate. The method further comprises forming an uneven layer provided between the first electrode and the substrate, and a surface of the uneven layer corresponding to the first electrode and away from the substrate is not even. The first electrode and/or the second electrode provided on a light output side of the OLED device comprise(s) a metal layer.

For example, the uneven layer is a photoresist layer doped with small particles; the small particles are exposed from a surface of the photoresist layer corresponding to the first electrode and away from the substrate. A formation of the photoresist layer doped with small particles comprises: forming a photoresist thin film doped with the small particles on the substrate; and exposing and developing the substrate on which the photoresist thin film is formed with a half or gray tone mask to form a photoresist partially retained region and a photoresist completely retained region, wherein the photoresist partially retained region corresponds to the first electrode and the small particles in the photoresist partially retained region are exposed, and the photoresist completely retained region corresponds to the other region.

For example, a portion of the uneven layer corresponding to the first electrode comprises poly-silicon. A formation of the uneven layer comprises: forming an amorphous silicon thin film on the substrate; and performing a crystallization treatment on a portion of the amorphous silicon thin film corresponding to the first electrode so that the portion of the amorphous silicon thin film is changed into the poly-silicon and the uneven layer is formed.

For example, the first electrode comprises a non-transparent metal layer, and the second electrode comprises a transparent metal layer.

BRIEF DESCRIPTION OF THE DRAWINGS

In order to clearly illustrate the embodiments of the disclosure and the technical solution of the prior art, the drawings of the embodiments or related to the description of the prior art will be briefly described in the following; it is obvious that the described drawings are only related to some embodiments of the disclosure. Based on the drawings herein, those skilled in the art can obtain other drawing(s), without any inventive work.

DETAILED DESCRIPTION OF THE EMBODIMENTS

The technical solutions of the embodiment will be described below in a clearly and fully understandable way in connection with the drawings related to the embodiments of the disclosure. It is obvious that the embodiments are just a part but not all of the embodiments of the disclosure. Based on the described embodiments herein, those skilled in the art can obtain other embodiment(s), without any inventive work, which should be within the scope of the disclosure.

Figure 1:
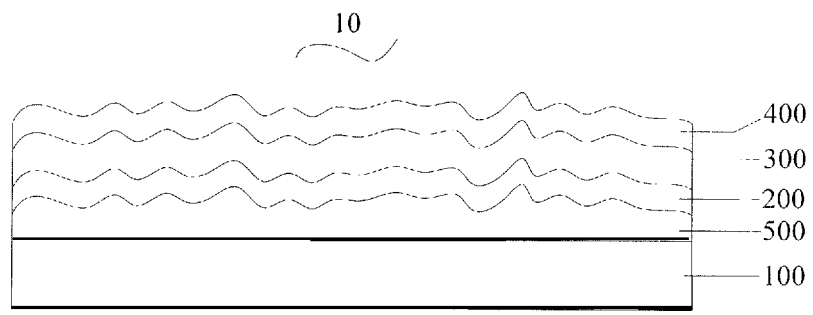
FIG. 1 is a structural schematic diagram illustrating an OLED device according to embodiments of the disclosure.
Figure 2:
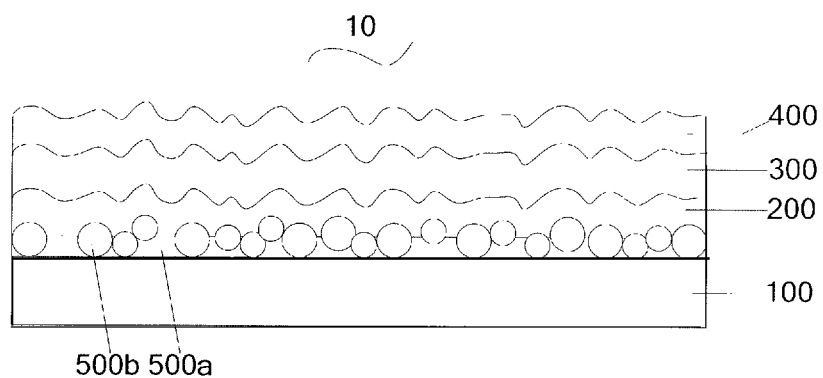
FIG. 2 is a structural schematic diagram illustrating an OLED device according to the embodiments of the disclosure.
Figure 3:
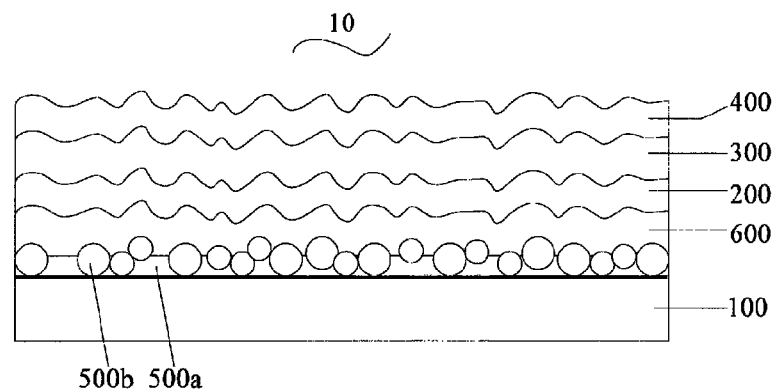
FIG. 3 is a structural schematic diagram illustrating an OLED device according to the embodiments of the disclosure.

The embodiments of the disclosure provide an OLED device 10. As shown in FIG. 1 to FIG. 3, the OLED device 10 comprises a substrate 100, and a first electrode 200, an organic material function layer 300 and a second electrode 400 which are sequentially provided on the substrate 100. Furthermore, the OLED device 10 further comprises an uneven layer 500 provided between the first electrode 200 and the substrate 100, and a surface of the uneven layer 500 corresponding to the first electrode 200 and away from the substrate 100 is not even.

For example, the first electrode 200 and/or the second electrode 400 provided on a light output side of the OLED device 10 comprise(s) a metal layer.

It should be noted that the material for forming the uneven layer 500 and the structure thereof are not limited herein provided that the surface of the uneven layer 500 corresponding to the first electrode 200 and away from the substrate 100 is not even.

In the case that the uneven layer 500 comprises a conductive material, an insulating layer is necessary to be provided between the uneven layer 500 and the first electrode 200.

It should be noted that, the uneven layer 500 is provided underneath the first electrode 200, which means that the underneath uneven layer 500 is formed before the upper first electrode 200 during the fabrication process. Hence, in the case that the surface of the uneven layer 500 corresponding to the first electrode 200 and away from the substrate 100 is not even, the first electrode 200 formed on the uneven layer 500 changes with the upper surface of uneven layer 500; and the organic material function layer 300 and the second electrode 400 formed on the first electrode 200 change accordingly. In this way, the first electrode 200, the organic material function layer 300 and the second electrode 400 all have uneven surfaces.

It should be noted that the first electrode 200 is a cathode or an anode and the second electrode 400 is the anode or the cathode. That is, if the first electrode 200 is the cathode, then the second electrode 400 is the anode; if the first electrode 200 is the anode, then the second electrode 400 is the cathode.

The organic material function layer 300 at least comprises a light-emitting layer. On this basis, in order to enhance the efficiency of injecting electrons and holes into the light-emitting layer, the organic material function layer 300 for example further comprises an electron transport layer, a hole transport layer, an electron injection layer provided between the cathode and the electron transport layer, a hole injection layer provided between the hole transport layer and the anode, and other function layers.

In the case that a working voltage is applied between the anode and the cathode, holes in the anode and electrons in the cathode are all injected into the light emitting layer; when the holes meet the electrons in the light-emitting layer, electron-hole pairs are formed thereby and an energy is released, the energy is sent out in the form of light and the light is emitted uniformly from both sides of the organic material function layer 300.

For example, the light emitted from the light emitting layer is red, green or blue light; and of course, the light may be white light, which is not limited herein.

The OLED device 10, for example, is of top-emission type, e.g.: the second electrode 400 comprises a transparent or semi-transparent metal layer (the thickness thereof is relatively thinner), the first electrode 200 comprises a non-transparent metal layer (the thickness thereof is relatively thicker). Or, the OLED device 10 for example is of bottom-emission type, e.g. the first electrode 200 comprises the transparent or semi-transparent metal layer (the thickness thereof is relatively thinner), the second electrode 400 comprises the non-transparent metal layer (the thickness thereof is relatively thicker). Of course, the OLED device 10 may be of bilateral-emission type, e.g., the second electrode 400 and the first electrode 200 both comprise the transparent or semi-transparent metal layer (the thicknesses thereof are relatively thinner).

For example, the non-transparent metal layer is an Ag layer with relatively thicker thickness, and the semi-transparent metal layer is an Ag layer with relatively thinner thickness.

The embodiments of the disclosure provide the OLED device 10 comprising the substrate 100, and the first electrode 200, the organic material function layer 300 and the second electrode 400 which are sequentially provided on the substrate 100. Furthermore, the OLED device 10 further comprises the uneven layer 500 provided between the first electrode 200 and the substrate 100, and the surface of the uneven layer 500 corresponding to the first electrode 200 and away from the substrate 100 is not even. The first electrode 200 and/or the second electrode 400 provided on the light output side of the OLED device 10 comprise(s) the metal layer.

The surface of the uneven layer 500 corresponding to the first electrode 200 and away from the substrate 100 is not even, so that the first electrode 200 and the second electrode 400 provided on the uneven layer 500 both become uneven electrode layers. Hence, when the light emitted from the organic material function layer 300 is incident onto the first electrode 200 and/or the second electrode 400 formed of transparent metal materials, the light output efficiency of the OLED device is enhanced as the loss caused by the plasma electromagnetic waves generated by the light on the surface of the metal electrode is reduced.

For example, the first electrode 200 comprises a reflective non-transparent metal layer, and the second electrode 400 comprises a transflective semi-transparent metal layer. The non-transparent first electrode 200, the organic material function layer 300 and the semi-transparent second electrode 400 form a micro-cavity, so that the light output efficiency is further enhanced by utilizing the interference effect of light in the micro-cavity (micro-cavity effect).

The surface roughness of poly-silicon is relatively high; so, the portion of the uneven layer 500 corresponding to the first electrode 200 for example comprises the poly-silicon. For example, the poly-silicon is obtained by crystallizing amorphous silicon.

For example, only the portion of the amorphous silicon thin film corresponding to the first electrode 200 is crystallized to obtain the poly-silicon with relatively high roughness, whereas other portions of the amorphous silicon thin film not corresponding to the first electrode 200 is not crystallized and maintain its intrinsic evenness.

For example, as illustrated in FIG. 2, the uneven layer 500 is a photoresist layer 500*a* doped with small particles 500*b*.

The small particles 500*b* are exposed from a surface of the photoresist layer 500*a* corresponding to the first electrode 200 and away from the substrate 100.

By selecting the material for forming the photoresist layer and the material for forming the small particles to have a proper etch ratio, the photoresist layer in the region corresponding to the first electrode 200 is etched and the small particles 500b in this region is not etched and is exposed, so that the uneven surface is obtained.

Besides, as each of the small particles 500b is of irregular shape, the surface of the photoresist layer 500a away from the substrate 100 will still become uneven even if the small particles 500b are all provided tightly.

Herein, during forming the photoresist layer 500a, the region corresponding to the first electrode 200 is called as a photoresist partially retained region, and the other region is called as a photoresist completely retained region. After a development process, the small particles 500b in the photoresist partially retained region are exposed so that the uneven surface is formed.

Furthermore, in order to ensure that the surface of the photoresist layer 500a has a good unevenness, the surface of the photoresist layer 500a for example is formed to have folds. In this case, the interstice among the small particles 500b should not be too large, which means that the doping concentration of the small particles 500b should not be too low and the particle size of the small particles 500b should not be too large. Hence, in the embodiments of the disclosure, for example, the doping concentration of the small particles 500b ranges from 80% to 100% and the particle size of the small particles 500b is less than 10 nm.

For example, the interstice among the small particles 500b is further reduced by providing the small particles 500b to have different sizes.

For example, the small particles 500b comprise: small ceramic particles or small metal particles.

By properly selecting the material for forming the small particles 500b, the chemical property of the small particles is made to be different from that of the photoresist. Hence, when the photoresist underneath the first electrode 200 is partially removed from the photoresist layer doped with small particles 500b, the small particles 500b will not be influenced.

For example, as illustrated in FIG. 3, in the case that the small particles 500b comprise small metal particles, the OLED device 10 further comprises an insulating layer 600 provided between the photoresist layer 500a and the first electrode 200 to insulate the conductive metal particles in the photoresist layer 500a from the first electrode 200.

For example, the insulating layer 600 is formed of silicon dioxide, silicon nitride and so on.

The embodiments of the disclosure further provide a display apparatus, comprising the OLED device 10 as described above.

The OLED device 10 for example is applied to a passive matrix display apparatus or an active matrix display apparatus, which is not limited here.

The embodiments of the disclosure provide the display apparatus comprising the OLED device 10 as described above. The surface of the uneven layer 500 corresponding to the first electrode 200 and away from the substrate 100 is not even, so that the first electrode 200 and the second electrode 400 provided on the uneven layer 500 both become uneven electrode layers. Hence, when the light emitted from the organic material function layer 300 is incident onto the first electrode 200 and/or the second electrode 400 formed of transparent metal materials, the light output efficiency of the OLED device is enhanced as the loss caused by the plasma electromagnetic waves generated by the light on the surface of the metal electrode is reduced.

Figure 4:
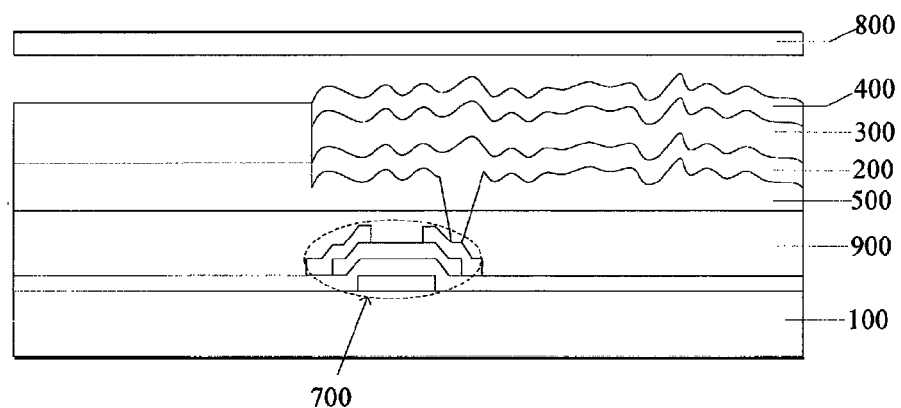
FIG. 4 is a structural schematic diagram illustrating an OLED display apparatus according to the embodiments of the disclosure.

Considering the disadvantages of the passive matrix in its application to large-size display apparatus, the display apparatus in the embodiments of the disclosure for example is the active matrix display apparatus; as illustrated in FIG. 4, the display apparatus comprises a thin film transistor 700 provided between the substrate 100 and the uneven layer 500 of the OLED device 10.

The thin film transistor 700 comprises a gate electrode, a gate insulation layer, a semiconductor active layer, a source electrode and a drain electrode. The thin film transistor 700 is of top-gate type or bottom-gate type.

Furthermore, if the drain electrode is to be electrically connected to the second electrode 400, the second electrode 400 has to pass through the organic function layer 300 and the first electrode 200 to be electrically connected with the drain electrode. In this case, on the one hand, a short circuit easily occurs between the second electrode 400 and the first electrode 200; and on the other hand, the fabrication process is relatively complex if the second electrode 400 passes through the organic material function layer 300. Based on this, in the embodiments of the disclosure, the drain electrode of the thin film transistor 700 is electrically connected to the first electrode 200 preferably.

If the first electrode 200 is used as the anode, then the voltage of the second electrode 400 using as the cathode is constant; if the first electrode 200 is used as the cathode, then the voltage of the second electrode 400 using as the anode is constant.

As illustrated in FIG. 4, the OLED display apparatus further comprises a package substrate 800 provided above the second electrode 400.

Furthermore, the first electrode 200 has to pass through the via hole provided in the uneven layer 500 to be electrically connected with the drain electrode of the thin film transistor 700; therefore, in the case that the uneven layer 500 is the photoresist layer 500a doped with small particles 500b, the doping concentration of the small particles 500b should not be too high otherwise it will be difficult to form the via hole in the photoresist layer 500a. Based on this, in the embodiments of the disclosure, the doping concentration of the small particles 500b ranges from 80% to 90%.

For example, as illustrated in FIG. 4, a planarization layer 900 is provided between the thin film transistor 700 and the uneven layer 500, so that the phenomena that disconnections of the uneven layer 500, the first electrode 200 and the like which are formed subsequently easily occur due to the height difference caused by the underneath thin film transistor 700 is prevented.

The embodiments of the disclosure further provide a method of manufacturing the OLED device. The method comprises: forming the first electrode 200, the organic material function layer 300 and the second electrode 400 sequentially on the substrate 100. The method further comprises: forming the uneven layer 500 between the first electrode 200 and the substrate 100, and the surface of the uneven layer 500 corresponding to the first electrode 200 and away from the substrate 100 is not even.

For example, the first electrode 200 and/or the second electrode 400 provided on the light output side of the OLED device 10 comprise(s) the metal layer.

It should be noted that, the uneven layer 500 is provided underneath the first electrode 200, which means that the underneath uneven layer 500 is formed before the upper first electrode 200 in the fabrication process. Hence, in the case that the surface of the uneven layer 500 corresponding to the first electrode 200 and away from the substrate 100 is not even, the first electrode 200 formed on the uneven layer 500 changes with the upper surface of uneven layer 500; and the organic material function layer 300 and the second electrode 400 formed on the first electrode 200 change accordingly. In this way, the first electrode 200, the organic material function layer 300 and the second electrode 400 all have uneven surfaces.

The embodiments of the disclosure provide the method of manufacturing the OLED device. The surface of the uneven layer 500 corresponding to the first electrode 200 and away from the substrate 100 is not even, so that the first electrode 200 and the second electrode 400 provided on the uneven layer 500 both become uneven electrode layers. Hence, when the light emitted from the organic material function layer 300 is incident onto the first electrode 200 and/or the second electrode 400 formed of transparent metal materials, the light output efficiency of the OLED device is enhanced as the loss caused by the plasma electromagnetic waves generated by the light on the surface of the metal electrode is reduced.

For example, the first electrode 200 comprises the reflective non-transparent metal layer, and the second electrode 400 comprises the transflective semi-transparent metal layer. The non-transparent first electrode 200, the organic material function layer 300 and the semi-transparent second electrode 400 form the micro-cavity, so that the light output efficiency is further enhanced by utilizing the interference effect of light in the micro-cavity (micro-cavity effect).

For example, taking FIG. 1 for reference, the portion of the uneven layer 500 corresponding to the first electrode 200 comprises the poly-silicon. In this case, the formation of the uneven layer 500 comprises the following steps of:

Forming an amorphous silicon thin film on the substrate 100, for example, by PECVD (Plasma Enhanced Chemical Vapor Deposition);

Performing a crystallization treatment on a portion of the amorphous silicon thin film corresponding to the first electrode so that the portion of the amorphous silicon thin film is changed into poly-silicon and the uneven layer is formed.

The crystallization treatment, for example, comprises ELA (Excimer Laser Annealing), MIC (Metal Induced Crystallization), SPC (Solid Phase Crystallization) and so on.

Besides, before performing the crystallization treatment, a high-temperature oven for example is used dehydrogenize the amorphous silicon thin film in order to prevent a hydrogen-explosion phenomenon during the crystallization treatment and to decrease the defect density of the poly-silicon thin film.

Figure 5:
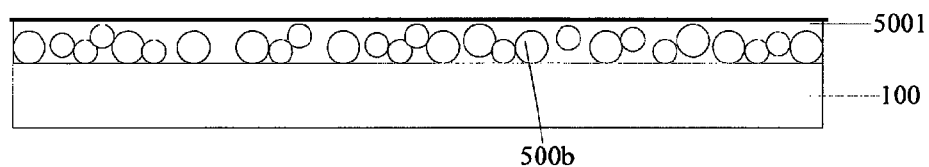
FIGS. 5-6 are schematic diagrams illustrating a process of forming a photoresist layer according to the embodiments of the disclosure.

For example, taking FIG. 2 for reference, the uneven layer 500 is the photoresist layer 500a doped with small particles 500b; the small particles 500b expose from the surface of the photoresist layer 500a corresponding to the first electrode 200 and away from the substrate 100. In this case, the formation of the uneven layer 500 comprises the following steps of:

S101, as illustrated in FIG. 5, forming a photoresist thin film 5001 doped with the small particles 500b on the substrate 100.

Figure 6:
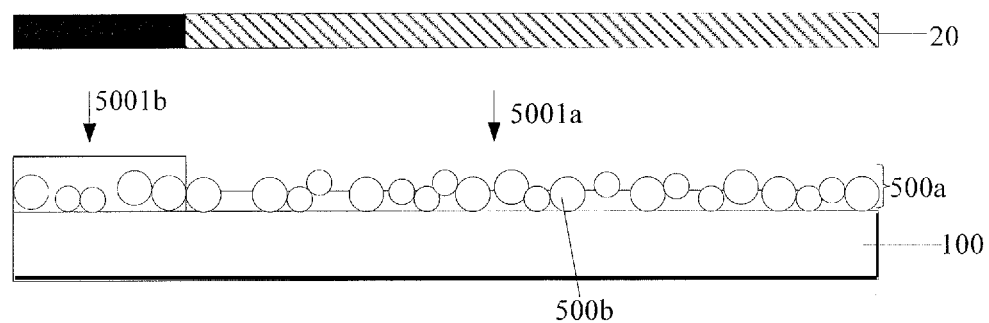

S102, as illustrated in FIG. 6, exposing and developing the substrate on which the photoresist thin film 5001 is formed with a half or gray tone mask 20 to form the photoresist partially retained region 5001a and the photoresist completely retained region 5001b. The photoresist partially retained region corresponds to the first electrode 200, and the small particles 500b in the photoresist partially retained region are exposed. The photoresist completely retained region 5001b corresponds to the other region. In this way, the photoresist layer 500a doped with small particles 500b is formed.

The foregoing embodiments merely are exemplary embodiments of the disclosure, and not intended to define the scope of the disclosure, and the scope of the disclosure is determined by the appended claims.

The present application claims priority of Chinese Patent Application No. 201410191777.0 filed on May 8, 2014, the disclosure of which is incorporated herein by reference in its entirety as part of the present application.

What is claimed is:

1. An OLED device, comprising a substrate, and a first electrode, an organic material function layer and a second electrode which are sequentially provided on the substrate, wherein
   the OLED device further comprises an uneven layer provided between the first electrode and the substrate, and a surface of the uneven layer corresponding to the first electrode and away from the substrate is not even;
   the first electrode and/or the second electrode provided on a light output side of the OLED device comprise(s) a metal layer;
   the uneven layer is a photoresist layer doped with small particles;
   the small particles are exposed from a surface of the photoresist layer corresponding to the first electrode and away from the substrate;
   a photoresist partially retained region and a photoresist completely retained region of the photoresist layer are formed by exposing and developing the substrate on which a photoresist thin film is formed with a half or gray tone mask, wherein the photoresist partially retained region corresponds to the first electrode and the small particles in the photoresist partially retained region are exposed, and the photoresist completely retained region corresponds to the other region; and
   a particle size of the small particles is less than 10 nm.

2. The OLED device according to claim 1, wherein
   the small particles comprise small ceramic particles and small metal particles; and
   in the case that the small particles comprise the small metal particles, the OLED device further comprises an insulating layer provided between the photoresist layer and the first electrode.

3. The OLED device according to claim 1, wherein
   the first electrode comprises a non-transparent metal layer, and the second electrode comprises a transparent metal layer.

4. A display apparatus, comprising an OLED device according to claim 1.

5. The display apparatus according to claim 4, further comprising a thin film transistor provided between the substrate and the uneven layer of the OLED device, wherein
   a drain electrode of the thin film transistor is electrically connected with the first electrode of the OLED device.

6. The display apparatus according to claim 5, wherein
   the uneven layer is the photoresist layer doped with small particles, and the doping concentration of the small particles ranges from 80% to 90%.

7. A method of manufacturing an OLED device, comprising forming a first electrode, an organic material function layer and a second electrode sequentially on a substrate, wherein
   the method further comprises forming an uneven layer provided between the first electrode and the substrate, and a surface of the uneven layer corresponding to the first electrode and away from the substrate is not even;

the first electrode and/or the second electrode provided on a light output side of the OLED device comprise(s) a metal layer;

the uneven layer is a photoresist layer doped with small particles;

the small articles are exposed from a surface of the photoresist layer corresponding to the first electrode and away from the substrate;

a formation of the photoresist layer doped with small particles comprises:
  forming a photoresist thin film doped with the small particles on the substrate; and
  exposing and developing the substrate on which the photoresist thin film is formed with a half or gray tone mask to form photoresist partially retained region and photoresist completely retained region, wherein the photoresist partially retained region corresponds to the first electrode and the small particles in the photoresist partially retained region are exposed, and the photoresist completely retained region corresponds to the other region, and forming the photoresist layer; and a particle size of the small particles is less than 10 nm.

8. The method according to claim 7, wherein the first electrode comprises a non-transparent metal layer, and the second electrode comprises a transparent metal layer.

* * * * *